(12) United States Patent
Liu et al.

(10) Patent No.: US 11,444,244 B2
(45) Date of Patent: Sep. 13, 2022

(54) MASK PLATE AND FABRICATION METHOD THEREOF

(71) Applicant: Ningbo Semiconductor International Corporation, Ningbo (CN)

(72) Inventors: Mengbin Liu, Ningbo (CN); Hailong Luo, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 323 days.

(21) Appl. No.: 16/209,862

(22) Filed: Dec. 4, 2018

(65) Prior Publication Data

US 2019/0326514 A1 Oct. 24, 2019

Related U.S. Application Data

(63) Continuation of application No. PCT/CN2018/094246, filed on Jul. 3, 2018.

(30) Foreign Application Priority Data

Apr. 19, 2018 (CN) .......................... 201810354999.8

(51) Int. Cl.
*H01L 51/00* (2006.01)
*H01L 51/56* (2006.01)
(Continued)

(52) U.S. Cl.
CPC ........ *H01L 51/0011* (2013.01); *C23C 16/042* (2013.01); *C23F 1/02* (2013.01); *H01L 51/001* (2013.01); *H01L 51/56* (2013.01); *H01L 51/5012* (2013.01); *H01L 51/5056* (2013.01); *H01L 51/5072* (2013.01)

(58) Field of Classification Search
None
See application file for complete search history.

(56) References Cited

U.S. PATENT DOCUMENTS

| 4,448,865 A | 5/1984 | Bohlen et al. |
| 5,569,569 A | 10/1996 | Goto et al. |

(Continued)

FOREIGN PATENT DOCUMENTS

| CN | 107541698 A | 1/2018 |
| JP | 2003100583 A | 4/2003 |
| KR | 20010047178 A | 6/2001 |

*Primary Examiner* — Abul Kalam
(74) *Attorney, Agent, or Firm* — Anova Law Group, PLLC

(57) ABSTRACT

The present disclosure provides a mask plate and fabrication method thereof. The mask plate includes a substrate, having a first surface and a second surface, and containing a plurality of openings. The mask plate also includes a mask pattern layer, formed on the first surface of the substrate and including a plurality of pattern regions and a shield region surrounding the plurality of pattern regions. Each pattern region includes at least one through hole, and each opening formed in the substrate exposes a pattern region and the at least one through hole in the pattern region. The mask plate further includes a top substrate layer, formed on the mask pattern layer. The top substrate layer contains a plurality of grooves passing through the top substrate layer, and each groove exposes a pattern region in the mask pattern layer and exposes the at least one through hole in the pattern region.

5 Claims, 11 Drawing Sheets

(51) Int. Cl.
*C23C 16/04* (2006.01)
*C23F 1/02* (2006.01)
*H01L 51/50* (2006.01)

(56) References Cited

U.S. PATENT DOCUMENTS

| | | | | |
|---|---|---|---|---|
| 6,319,636 | B1 * | 11/2001 | Ham | G03F 1/20 |
| | | | | 378/35 |
| 7,588,815 | B2 * | 9/2009 | Morimoto | G03F 1/20 |
| | | | | 428/119 |
| 7,824,825 | B2 * | 11/2010 | Nishiwaki | B82Y 10/00 |
| | | | | 430/5 |
| 2002/0001964 | A1 * | 1/2002 | Choi | G03F 1/20 |
| | | | | 438/719 |
| 2003/0010749 | A1 * | 1/2003 | Yoshizawa | G03F 1/20 |
| | | | | 430/5 |
| 2003/0031939 | A1 | 2/2003 | Butschke et al. | |
| 2019/0341265 | A1 * | 11/2019 | Liu | H01L 21/308 |

\* cited by examiner

MASK PLATE AND FABRICATION METHOD THEREOF

CROSS-REFERENCES TO RELATED APPLICATIONS

This application is a continuation application of PCT application No. PCT/CN2018/094246, filed on Jul. 3, 2018, which claims the priority of Chinese Patent Application No. CN201810354999.8, filed on Apr. 19, 2018, the entire content of all of which is incorporated herein by reference.

FIELD OF THE DISCLOSURE

The present disclosure generally relates to the field of semiconductor fabrication technology and, more particularly, relates to a mask plate and a fabrication method thereof.

BACKGROUND

Organic light-emitting diode (OLED) displays have the advantages of large viewing angle, sharp color, low power consumption, etc. over liquid crystal displays. In recent years, industrialization of OLED displays has been rapidly speeded.

According to the current manufacturing process of an OLED display panel, an organic light-emitting layer is usually formed by vapor deposition, and a metal mask is generally used during the evaporation of the organic light-emitting layer. The quality and the positional accuracy of the openings in the metal mask directly affect the deposition result of the organic light-emitting layer, and thus affect the quality of the subsequently-fabricated product. Currently, the process for manufacturing a metal mask for OLED usually includes performing a chemical etching process on Invar (a nickel-iron alloy) to fabricate the mask plate. For example, first, a photoresist or photosensitive dry film is coated on the surface of Invar; then, the fine pattern of the mask plate is transferred onto the photoresist or photosensitive film by an exposure process; and finally, a fine metal mask is formed by a development process and a chemical etching method. The formed metal mask has a precision usually on the order of micrometers. Therefore, the quality and the precision of the metal mask may not be able to meet the requirements.

The disclosed mask plate and fabrication method are directed to solve one or more problems set forth above and other problems in the art.

BRIEF SUMMARY OF THE DISCLOSURE

One aspect of the present disclosure provides a mask plate. The mask plate includes a substrate, having a first surface and a second surface opposite to the first surface. The substrate contains a plurality of openings passing through the substrate. The mask plate also includes a mask pattern layer, formed on the first surface of the substrate and including a plurality of pattern regions and a shield region surrounding the plurality of pattern regions. Each pattern region of the plurality of pattern regions includes at least one through hole, and each opening of the plurality of openings formed in the substrate exposes a pattern region of the plurality of pattern regions and exposes the at least one through hole in the pattern region. The mask plate further includes a top substrate layer, formed on the surface of the mask pattern layer opposite to the substrate. The top substrate layer contains a plurality of grooves passing through the top substrate layer, and each groove of the plurality of grooves formed in the top substrate layer exposes a pattern region of the plurality of pattern regions in the mask pattern layer and exposes the at least one through hole in the pattern region.

Another aspect of the present disclosure provides a fabrication method for a mask plate. The fabrication method includes providing a base structure, the base structure including a substrate, a top substrate layer, and a mask layer there-between; etching the top substrate layer to form a plurality of grooves passing through the top substrate layer; and etching the mask layer according to a predetermined pattern to form a mask pattern layer including a plurality of pattern regions and a shield region surrounding the plurality of pattern regions. Each pattern region of the plurality of pattern regions includes at least one through hole, and each groove of the plurality of grooves exposes a pattern region of the plurality of pattern regions in the mask pattern layer and exposes the at least one through hole in the pattern region. The fabrication method further includes etching the substrate to form a plurality of openings passing through the substrate. Each opening of the plurality of openings exposes a pattern region of the plurality of pattern regions.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1A:
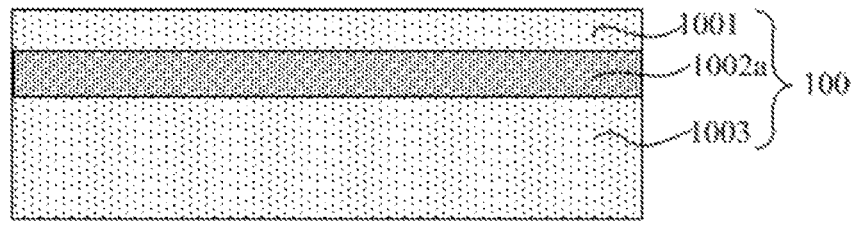
FIGS. 1A-1J illustrate schematic cross-sectional views of structures at certain stages of a method for fabricating an exemplary mask plate according to some embodiments of the present disclosure.

In the following description, numerous specific details are set forth to provide a more thorough understanding of the disclosure. However, it will be apparent to those skilled in the art that the present disclosure may be implemented without one or more of these details. In other instances, some of the technical features known in the art are described herein to avoid confusion with the present disclosure.

It should be understood that the disclosed methods and structures can be implemented in various forms and should not be construed as limited to the embodiments set forth in the present disclosure. Instead, these embodiments are provided so that the present disclosure will be thorough and complete. In the accompanying drawings, the size and relative dimensions of the layers and regions may be enlarged for clarity. The same reference numbers indicate the same elements throughout the present disclosure.

It should be understood that when an element or layer is referred to as "on", "adjacent to", "connected to" or "coupled to" another element or layer, it may be directly placed on the other element or layer, or may be adjacent to, connected to, or coupled to the other element or layer. Alternatively, the element or layer may be indirectly placed on the other element or layer, or may be adjacent to, connected to, or coupled to the other element or layer as some intermediate elements and/or layers are disposed between. In contrast, when an element is referred to as "directly on", "directly adjacent to", "directly connected to", or "directly coupled to" another element or layer, no intermediate element or layer is disposed between.

It should be understood that although the terms such as first, second, third, etc. are used to describe various components, regions, layers, and/or portions, these components, regions, layers, and/or portions should not be limited by the terms of first, second, third, etc. These terms are merely used to distinguish an element, component, region, layer, or portion. Therefore, a first element, component, region, layer, or portion discussed in the present disclosure may be alternatively represented as a second element, component, region, layer, or portion.

Spatial relationship terms such as "under", "below", "the lower", "underneath", "above", "the upper", etc. are used here for illustrative purposes. The terms may be used to describe the relationship of one element or feature shown in a figure with respect to other elements or features. It should be understood that in addition to the orientation shown in the figures, the spatially relative terms are intended to encompass different orientations of the device in use and operation. For example, when a device in the figures is flipped, an element or feature described as "under another element", "under", or "below" may be oriented "above" the other element or feature. Thus, the exemplary terms "below" and "under" may include both up and down directions. A device may be otherwise oriented (e.g. rotated 90 degrees or oriented to other orientation), and the spatial descriptive terms used herein may be interpreted accordingly.

The terminologies used herein are merely for the purpose of describing the particular embodiments and are not intended to limit the scope of the present disclosure. When using the singular forms such as "a", "one", and "the/this", these terms are also intended to include the plural forms, unless otherwise specified in the context. It should also be understood that when the terms "composed of" and/or "comprising" are used in the specification, they are intended to describe the presence of features, integers, steps, operations, elements, and/or components, but not to exclude the presence or addition of one or more other features, integers, steps, operations, elements, components, and/or groups. When used in the present disclosure, the term "and/or" includes any and all combinations of the listed related items.

Various embodiments of the present disclosure are described herein with reference to schematic illustrations of cross-sectional views of the structures (and intermediate structures) according to the preferred embodiments of the present disclosure deviations from the illustrated shapes may be expected due to, e.g. manufacturing techniques and/or tolerances. Therefore, the embodiments of the present disclosure should not be limited to the specific shapes of the regions illustrated herein, but should include variations in the shapes due to, e.g. manufacturing. For example, an implanted region shown as a rectangle typically has rounded or curved features and/or an implantation gradient at the edges, rather than has a binary change from the implanted region to the non-implanted region. Similarly, a buried region formed by implantation can result in some implantation in the region between the buried region and the surface through which the implantation is performed. Therefore, the regions shown in the figures are illustrative and the shapes of the regions are not intended to represent the actual shapes of the regions of the device, and thus, the shapes of the regions are not intended to limit the scope of the present disclosure.

In order to make the present disclosure easy to understand, detailed steps and structures will be provided to explain the technical solutions of the present disclosure. In the following, various exemplary embodiments of the present disclosure are described in detail.

However, it should be noted that in addition to the embodiments described herein, the present disclosure may be implemented in other forms, which are also encompassed within the scope of the present disclosure.

The present disclosure provides a mask plate with improved quality and positional accuracy. The mask plate may include a substrate. The substrate may have a first surface and a second surface opposite to the first surface. A plurality of openings may be formed in the substrate with each opening passing through the substrate. The substrate may be made of a material that can be etched through a semiconductor etching process.

The mask plate may also include a mask pattern layer formed on the first surface of the substrate. The mask pattern layer may be made of a material that can be etched through a semiconductor etching process. The mask pattern layer may include a plurality of pattern regions and a shield region. Each pattern region may include a plurality of through holes, i.e., each pattern region may include at least one through hole. The plurality of openings in the substrate may expose the plurality of pattern regions of the mask pattern layer with each opening corresponding to a pattern region and exposing the plurality of through holes formed in the pattern region. That is, each opening of the plurality of openings formed in the substrate may expose a pattern region of the plurality of pattern regions of the mask pattern layer. The shield region of the mask pattern layer may be formed on the first surface of the substrate to surround the plurality of pattern regions.

The mask plate may further include a top substrate layer formed on the surface of the mask pattern layer facing away from the first surface of the substrate. The top substrate layer and the substrate may be on the two opposite sides of the mask pattern layer. A plurality of grooves may be formed in the top substrate layer with each groove extending through the top substrate layer. The plurality of grooves may expose the plurality of pattern regions of the mask pattern layer with each groove corresponding to a pattern region of the mask pattern layer and exposing the plurality of through holes formed in the pattern region. That is, each groove of the plurality of grooves may expose a pattern region of the plurality of pattern regions of the mask pattern layer.

The mask plate provided by the present disclosure is made by a semiconductor process including deposition, photolithography, etching, etc. Compared with a mask plate made through fine metal processing, where the precision of the fine processing of the mask plate may be only on the order of micrometers, a mask plate made by a semiconductor process according to the present disclosure may be able to achieve a precision on the order of nanometers. Therefore, semiconductor processing may improve the quality and the positional accuracy of the openings and the through holes in the mask pattern region. In addition, semiconductor processing may be conducive to reducing the sizes of the mask openings and the through holes as well as the thickness of the mask structure, and thus may satisfy the continuous reduction of the sizes of the semiconductor structure features and reduce the restrictions on the evaporation process associated with the sizes of the mask openings and the through holes as well as the thickness of the mask structure. Further, the substrate can serve as a mask frame for the mask plate to support and fix the mask structure. Because the mask structure is formed on the substrate by a semiconductor process, compared to a mask plate formed using fine metal processing, the disclosed mask plate may be able to reduce the problem caused by the displacement between the mask structure and the substrate. Therefore, the mask plate according to the present disclosure demonstrates higher quality and precision, and thus may be conducive to improving the precision of the evaporation process. When the disclosed mask plate is used in an evaporation process, the deposition quality of the evaporated material can be improved, and the quality of the subsequently-fabricated product can be improved.

In addition, the mask plate according to the present disclosure further includes a top substrate layer disposed on the mask pattern layer, and a plurality of grooves passing through the top substrate layer are formed in the top substrate layer. Each groove of the plurality of grooves exposes a pattern region of the plurality of pattern regions. Forming the plurality of grooves may be able to avoid the problem that, when the mask pattern layer is directly attached to a base substrate on which the evaporation pattern may be subsequently formed, the material evaporated onto the base substrate cannot grow normally. The grooves are arranged to ensure a distance between the base substrate and the mask plate, and thus facilitate the smooth performance of the evaporation process.

Further, the mask plate according to the present disclosure further includes a support layer, which can support the mask pattern layer of the mask, preventing bending deformation and breakage of the mask pattern layer, and also providing protection for the mask plate. The mask plate usually needs to be cleaned after the evaporation process is completed, and during the cleaning process, the support layer may be able to protect the mask plate from being corroded by the cleaning solution.

Exemplary Embodiment 1

In the following, the mask plates according to the present disclosure will be described in detail with references to FIGS. 1J and 2-6.

Figure 1B:
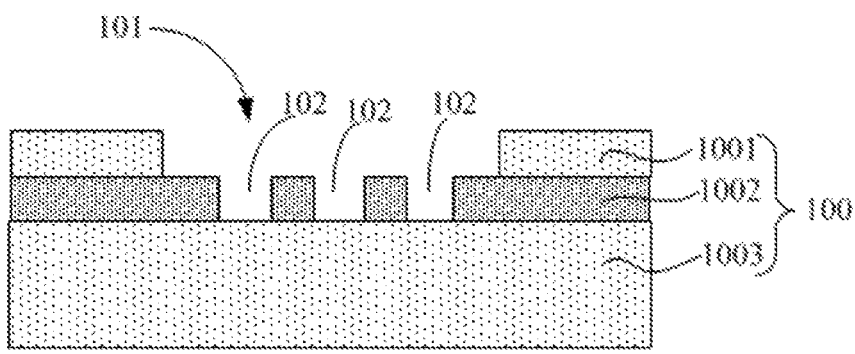
Figure 1C:
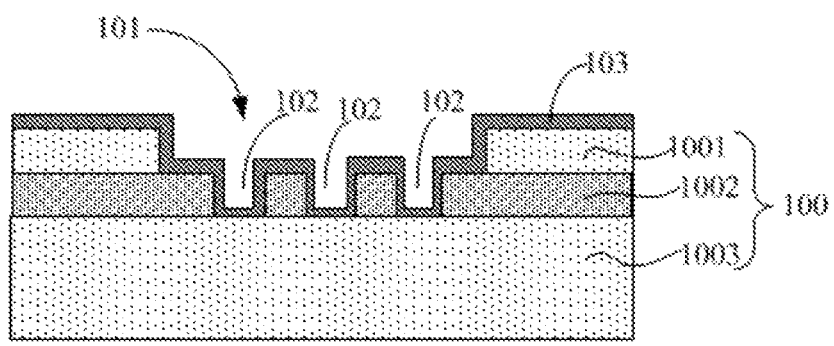
Figure 1D:
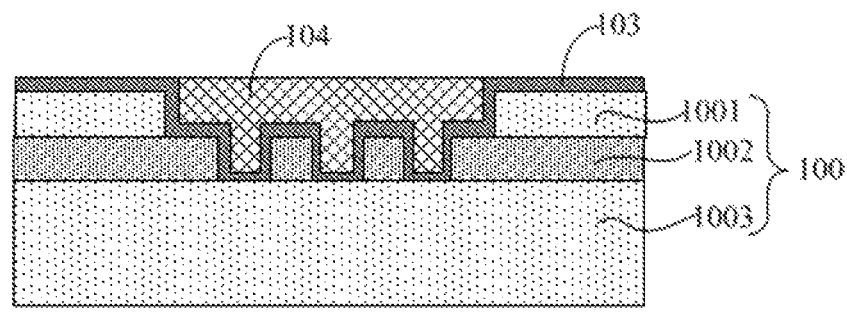
Figure 1E:
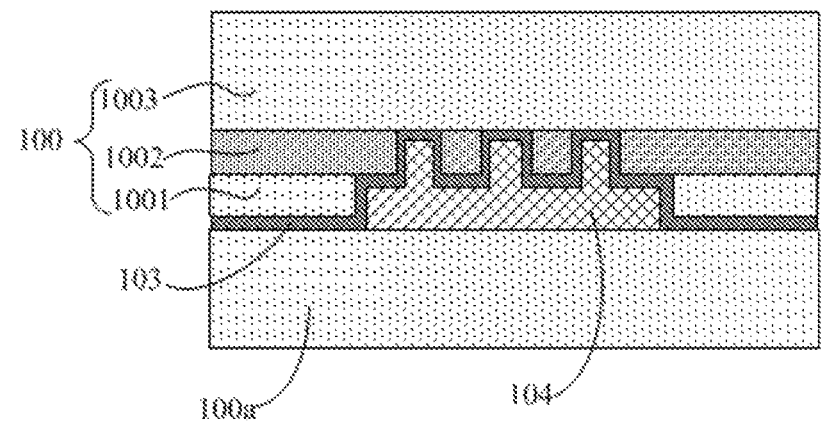
Figure 1F:
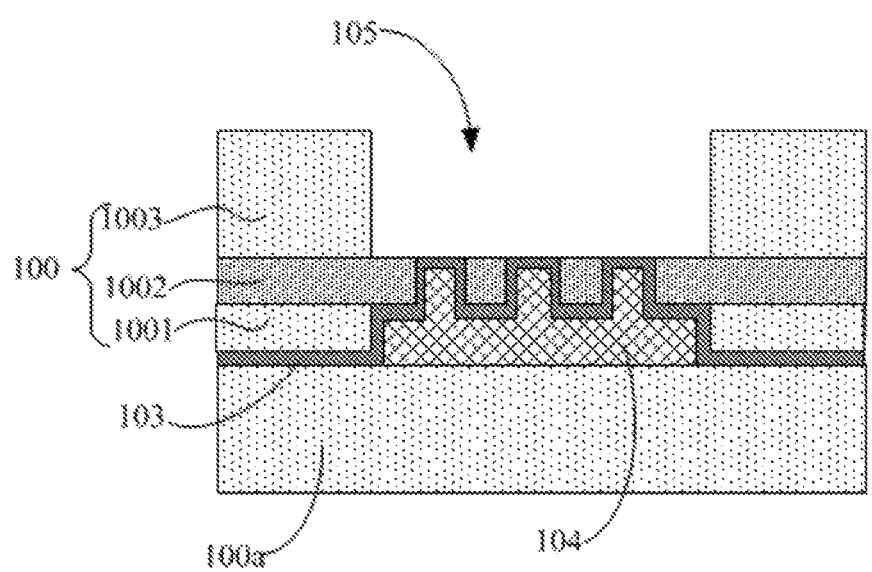
Figure 1G:
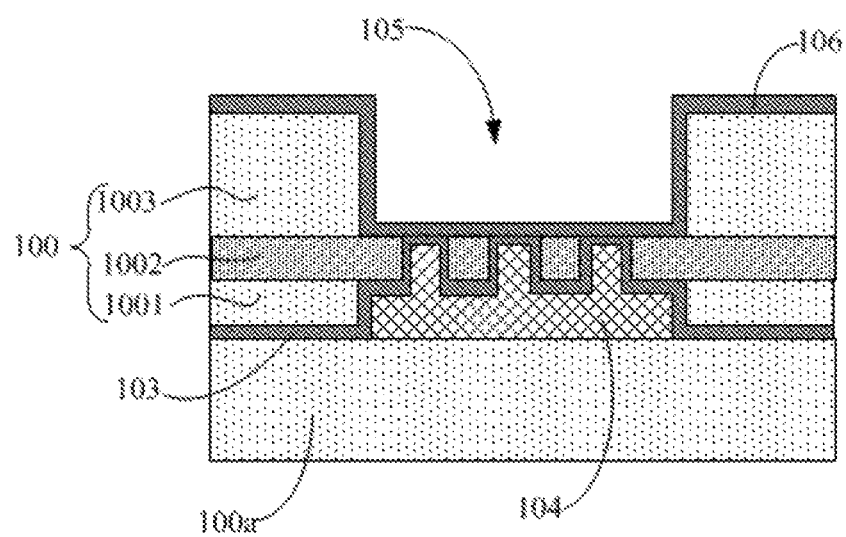
Figure 1H:
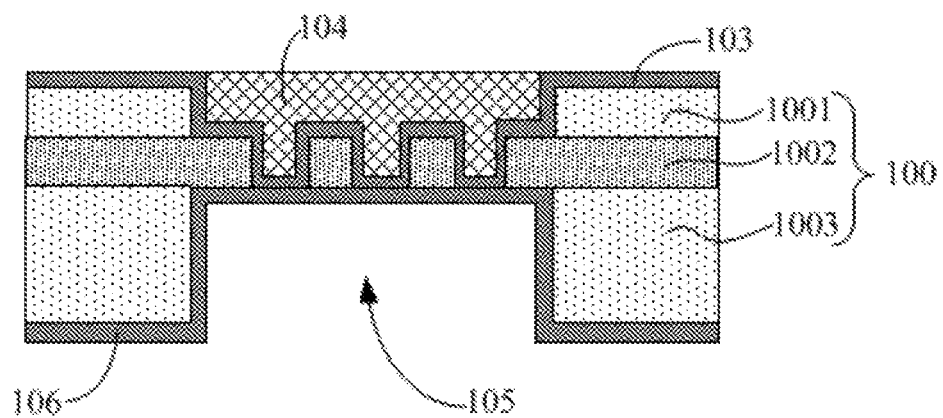
Figure 1I:
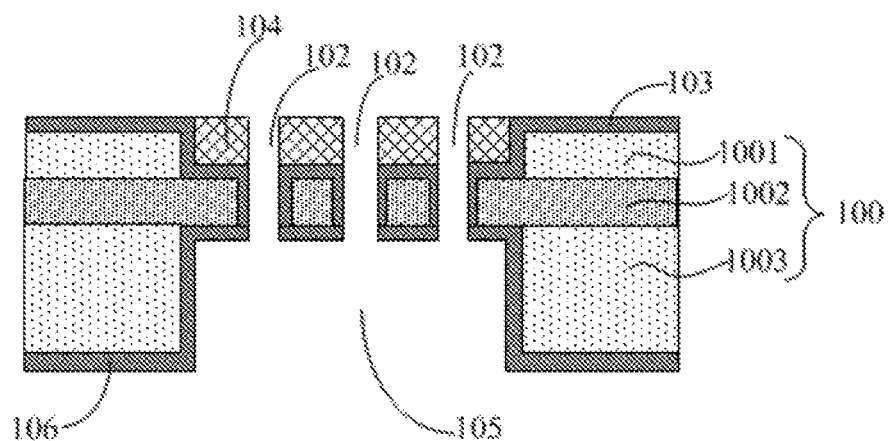
Figure 1J:
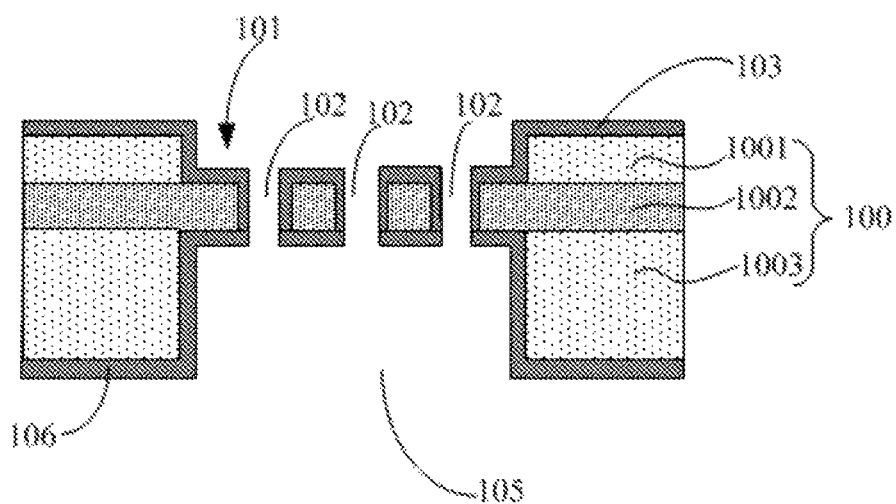

FIG. 1J illustrates a schematic cross-section view of an exemplary mask plate according to some embodiments of the present disclosure. Referring to FIG. 1J, the mask plate may include a substrate 1003. The substrate 1003 may have a first surface and a second surface opposite to the first surface. The mask plate may also include a plurality of openings 105 formed in the substrate 1003. The plurality of openings 105 may be formed through the substrate 1003. For illustrative purposed, only one opening is shown as an example in each of the related figures in the present disclosure. The substrate 1003 may be made of a material that can be etched through a semiconductor etching process.

In one embodiment, the mask plate may further include a mask pattern layer 1002 formed on the first surface of the substrate 1003. The mask pattern layer 1002 may be made of a material that can be etched through a semiconductor etching process. The mask pattern layer 1002 may have a third surface in contact with the first surface of the substrate 1003, and a fourth surface opposite to the third surface and away from the first surface of the substrate 1003.

The mask pattern layer 1002 may include a plurality of pattern regions (not labeled) and a shield region (not labeled). Each pattern region may include at least one through hole 102, i.e., each pattern region may include a plurality of through holes 102. The plurality of openings 105 may expose the plurality of pattern regions, and each opening 105 may correspond to a pattern region and may expose the plurality of through holes 102 formed in the pattern region. That is, the plurality of openings 105 may one-to-one correspond to the plurality of pattern regions. The shield region of the mask pattern layer 1002 may be formed on the first surface of the substrate 1003 to surround the plurality of pattern regions.

In some embodiments, the mask plate may also include a base structure. The base structure may include a top substrate layer, a substrate, and a mask pattern layer therebetween. In one embodiment, the substrate may have a first surface and a second surface opposite to the first surface. The mask pattern layer and a top substrate layer may be sequentially formed on the first surface of the substrate. In another embodiment, the base substrate may include, for example, a silicon on insulator (SOI) structure.

For example, a top substrate layer 1001 may be disposed on the fourth surface of the mask pattern layer 1002 that is away from the first surface of the substrate 1003. A plurality of grooves 101 may be formed in the top substrate layer 1001 with each groove 101 passing through the top substrate layer 1001. The plurality of grooves 101 may expose the plurality of pattern regions. Each groove 101 may correspond to a pattern region of the mask pattern layer 1002 and may expose the plurality of through holes 102 formed in the pattern region. That is, each groove 101 of the plurality of grooves may expose a pattern region of the plurality of pattern regions of the mask pattern layer 1002. Forming the plurality of grooves 101 may be able to avoid the problem that, when the mask pattern layer 1002 is directly attached to a base substrate on which the evaporation pattern may be subsequently formed, the material evaporated onto the base substrate cannot grow normally. The grooves may be arranged to ensure a distance between the base substrate and the mask plate, and thus facilitate the smooth performance of the evaporation process.

In one embodiment, the top substrate layer 1001 and the substrate 1003 may be made of a semiconductor material, including at least one of Si, Ge, SiGe, SiC, SiGeC, InAs, GaAs, InP, InGaAs, other Group III/V semiconductor compounds, etc. Alternatively, the top substrate layer 1001 and the substrate 1003 may be a multi-layer structure made of the semiconductor materials described above. In some embodiments, the substrate 1003 may be made of a non-semiconductor material. For example, the substrate 1003 may be made of silicon oxide.

The mask pattern layer 1002 may be made of any appropriate insulating material, such as oxide (especially silicon oxide), nitride (such as silicon nitride), carbide (such as silicon carbide), oxynitride (such as silicon oxynitride), etc.

In one embodiment, the substrate 1003 may be the bottom silicon layer of a silicon on insulator (SOI) structure. The top substrate layer may be the top silicon layer of the SOI structure. The mask pattern layer may be a buried layer in the SOI structure.

The buried layer may be made of a dielectric material including, but not limited to, oxides, nitrides, and oxynitrides. In one embodiment, the buried layer may be made of oxide, nitride, and/or oxynitride of silicon, but do not include oxide, nitride, or oxynitride of other elements. The buried layer may include crystalline or amorphous dielectric materials. In one embodiment, the buried layer may be made of crystalline dielectric materials. The buried layer may be formed using a method including, but not limited to ion implantation, thermal or plasma oxidation or nitridation, chemical vapor deposition (CVD), and physical vapor deposition (PVD).

In one embodiment, the buried layer may include an oxide (i.e., an oxide of a base semiconductor substrate) formed from a semiconductor material that the base semiconductor substrate is made of. Therefore, the buried layer may be formed from a surface layer of a base semiconductor substrate through an oxidation process. In one embodiment, the thickness of the buried dielectric layer may be in a range from about 50 Å to about 200 Å.

In one embodiment, the dimension of each opening 105 formed in the substrate may be appropriately set according to the needs of the actual dimension of the mask plate, and will not be specifically defined here. The opening 105 may have a rectangular, circular, elliptical, or any other appropriate shape.

In one embodiment, the dimension of each groove 101 formed in the top substrate layer 1001 may be appropriately set according to the needs of the actual dimension of the mask plate, and will not be specifically defined here. The groove 101 may have a rectangular, circular, elliptical, or any other appropriate shape.

In one embodiment, the plurality of grooves 101 and the plurality of openings 105 may have overlapped regions in the top view of the structure. For example, the plurality of grooves 101 and the plurality of openings 105 may be completely or may be partially overlapped in the view direction perpendicular to the first surface of the substrate 1003.

In one embodiment, each through hole 102 may be vertically formed in the mask pattern layer 1002. The shape of the through hole 102 in the top view of the structure may be appropriately set according to the needs of the actual device process size. For example, in the top view, the through hole 102 may have a rectangular, circular, elliptical, or any other appropriate shape.

In one embodiment, the number of the through holes 102 can be appropriately selected according to the actual process requirements of the mask plate. When the mask plate is used in, for example, an evaporation process for the organic layer in an OLED device, the plurality of through holes 102 may serve as a plurality of holes for evaporation.

Figure 3:
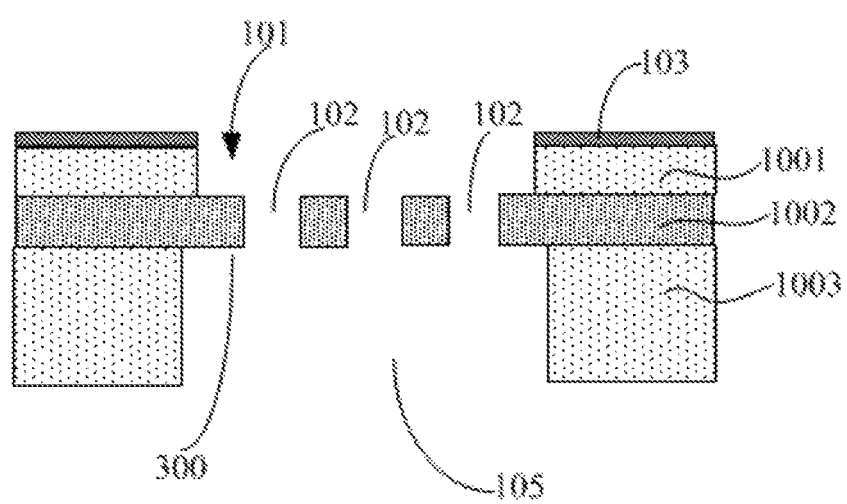
FIG. 3 illustrates a schematic cross-sectional view of another exemplary mask plate according to some embodiments of the present disclosure.

In one embodiment, as shown in FIG. 3 and also in FIG. 1J, the mask plate may further include a first support layer 103. The first support layer 103 may cover the top surface of the top substrate layer 1001.

In another embodiment, as shown in FIG. 1J, besides covering the top substrate layer 1001, and the first support layer 103 may further cover the surfaces of the plurality of grooves 101 as well as the surfaces of the plurality of through holes 102.

Further, as shown in FIG. 1J, the mask plate may also include a second support layer 106. The second support layer 106 may at least cover the surfaces of the plurality of openings 105 and the second surface of the substrate 1003. The second support layer 106 together with the first support layer 103 described above may surround the exposed surface of the mask plate. The second support layer 106 and the first support layer 103 may not only provide support for the mask pattern layer 1002, but also provide protection for the mask plate to prevent corrosion damages caused by the cleaning solution during a subsequently-performed cleaning process.

In another embodiment, as shown in IFG. 4, the mask plate may only include the second support layer 106. The second support layer 106 may at least cover the surfaces of the plurality of openings 105, the second surface of the substrate 1003, and the surfaces of the plurality of through holes 102.

Figure 5:
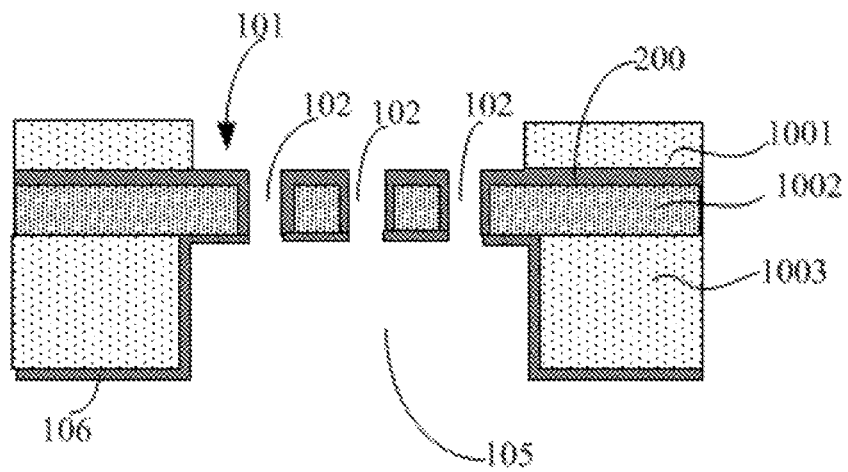
FIG. 5 illustrates a schematic cross-sectional view of another exemplary mask plate according to some embodiments of the present disclosure.

In one embodiment, as shown in FIG. 5, the mask plate may include a third support layer 200. The third support layer 200 may at least cover the fourth surface of the mask pattern layer 1002, which is the surface of the mask pattern layer 1002 facing away from the first surface of the substrate 1003, and the surfaces of the plurality of through holes 102. That is, the third support layer 200 may be disposed between the top substrate layer 1001 and the mask pattern layer 1002, and may also cover the surfaces (i.e., the sidewall surfaces) of the through holes 102.

Figure 6:
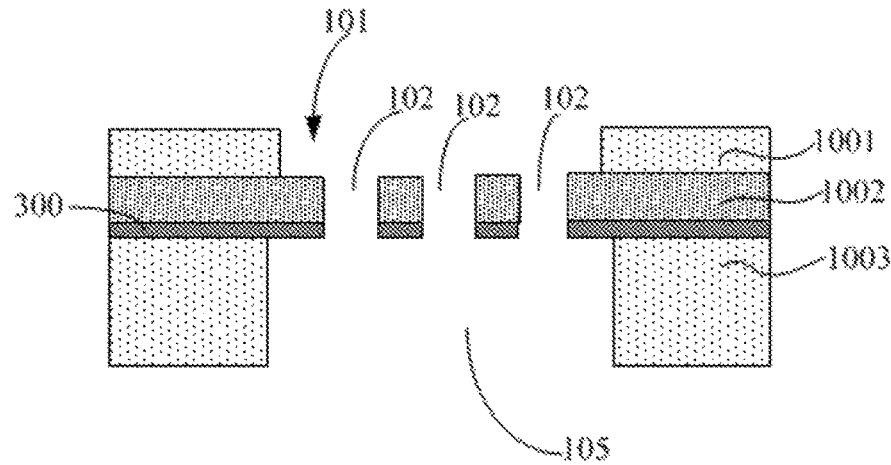
FIG. 6 illustrates a schematic cross-sectional view of another exemplary mask plate according to some embodiments of the present disclosure.

In another embodiment, as shown in FIG. 6, the mask plate may include a fourth support layer 300. The fourth support layer may at least cover the third surface of the mask pattern layer 1002, which is the surface of the mask pattern layer facing to the first surface of the substrate 1003. That is, the fourth support layer 300 may be disposed between the mask pattern layer 1002 and the substrate 1003. In addition, the fourth support layer 300 may also cover the surfaces of the plurality of through holes 102.

In one embodiment, the thickness of the support layer (e.g. the first support layer, the second support layer, the third support layer, and the fourth support layer) formed on the sidewall surfaces of a through hole 102 may be smaller than the radius of the through hole 102 in order to ensure that the through hole 102 continuously passes through the mask pattern layer 1002. That is, the thickness of the support layers described above may be smaller than the radius of the through hole 102.

Figure 2:
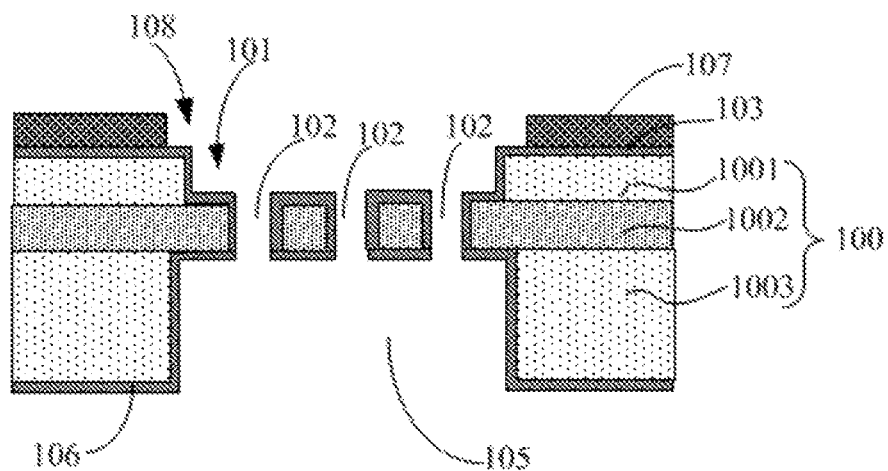
FIG. 2 illustrates a schematic cross-sectional view of another exemplary mask plate according to some embodiments of the present disclosure.

Further, as shown in FIG. 2, the mask plate may also include a protective layer 107. The protective layer 107 may be the topmost layer of the mask plate and a plurality of trenches 108 may be formed in the protective layer 107. Each trench 108 of the plurality of trenches 108 may expose a groove 101 of the plurality of grooves 101.

In one embodiment, the protective layer 107 may be made of any appropriate material including, but not limited to, insulating materials. For example, the protective layer 107 may be an inorganic insulating layer made of silicon oxide, silicon nitride, or silicon oxynitride. In another example, the protective layer 107 may be an insulating layer containing a layer of polyvinylphenol, polyimide, or siloxane.

It should be noted that the first support layer, the second support layer, the third support layer, and the fourth support layer described above may be made of any appropriate material. For example, the first support layer, the second support layer, the third support layer, and the fourth support layer may be made of a metal material or an insulating material. The metal material may include at least one of Ni, Ag, Au, Cu, Pt, Cr, Mo, Ti, Ta, Sn, W, and Al. In one embodiment, the metal material may be an alloy including two or more of Ni, Mo, Cr, Pt, and Sn. The insulating material may form an inorganic insulating layer including a silicon oxide layer, a silicon nitride layer, or a silicon oxynitride layer. Alternatively, the insulating material may form an insulating layer including a polyvinylphenol layer, a polyimide layer, or a siloxane layer, etc. In one embodiment, the insulating material may be silicon nitride.

In one embodiment, each support layer (i.e., each of the first support layer, the second support layer, the third support layer, and the fourth support layer) may include a single metal layer, or multiple metal layers.

In one embodiment, the first support layer 103, the second support layer 106, the third support layer 200, and the fourth support layer 300 may be made of a same material. In other embodiments, the first support layer, the second support layer, the third support layer, and the fourth support layer 300 may be made of different materials.

In addition, the support layer may support the mask pattern layer of the mask plate to prevent the mask pattern layer from bending or cracking. The support layer may also protect the mask plate. Usually after the evaporation process is completed, the mask plate needs to be cleaned, and the support layer may be able to protect the mask plate from being corroded by the cleaning solution during the cleaning process.

According to the OLED fabrication technology and methods, an evaporation process is often used to prepare OLED. During the evaporation process, small organic molecules (organic evaporation material) are heated in a vacuum chamber such that the organic molecules can be sublimated or melt-and-vaporized into material vapor. Further, through a plurality of holes formed in a mask plate according to various embodiments of the present disclosure, organic molecules can be deposited on a substrate (e.g. a glass substrate). The relative molecular weight of these small organic molecules is close to 2,000. Some organic evaporation materials that are frequently used include aromatic compounds, such as benzene, 8-hydroxyquinoline aluminum (AIQ), 1,2,4-triazole derivatives (TAZ), and PBD, Beq2, DPVBi, etc., aromatic fats, aromatic polyamines, triphenylamine derivatives. The organic evaporation materials may also include N,N'-bis(3-methylphenyl)-N,N'-diphenyl-1,1'-biphenyl-4,4'-diamine (TPD), N,N'-bis(1-naphthyl)-N,N'-diphenyl-1,1'-biphenyl-4,4'-diamine (NPD), etc.

In an OLED device, the organic layer usually includes a hole transport layer (HTL), an electron transport layer (ETL), and an organic light-emitting material, etc.

As such, description of the key structures of the mask plate according to the embodiments of the present disclosure is provided. A complete mask plate may further include other components or parts, which are not described in detail in the present disclosure.

The mask plate according to the embodiments of the present disclosure uses a substrate as a raw material. Specifically, a semiconductor substrate may serve as the raw material. Through an advanced semiconductor process, a plurality of through holes may be formed in the substrate, and thus form the mask plate. The plurality of through holes may be used as the holes for evaporation. In addition, by using a supporting layer to cover the surfaces of the mask plate that are exposed, including the surfaces of the through holes, the mask plate according to the embodiments of the present disclosure may demonstrate characteristics similar to the characteristics of metal masks. Further, compared to conventional metal masks, the mask plate according to the embodiments of the present disclosure has higher quality and precision, and thus may be conducive to improve the deposition quality of the organic layer during an evaporation process. Specifically, during the fabrication process for an OLED display panel, the evaporation quality of the organic layer may be improved, and thus, the performance and the quality of the OLED display panel obtained by using the mask plate may be improved.

Exemplary Embodiment 2

Figure 7:
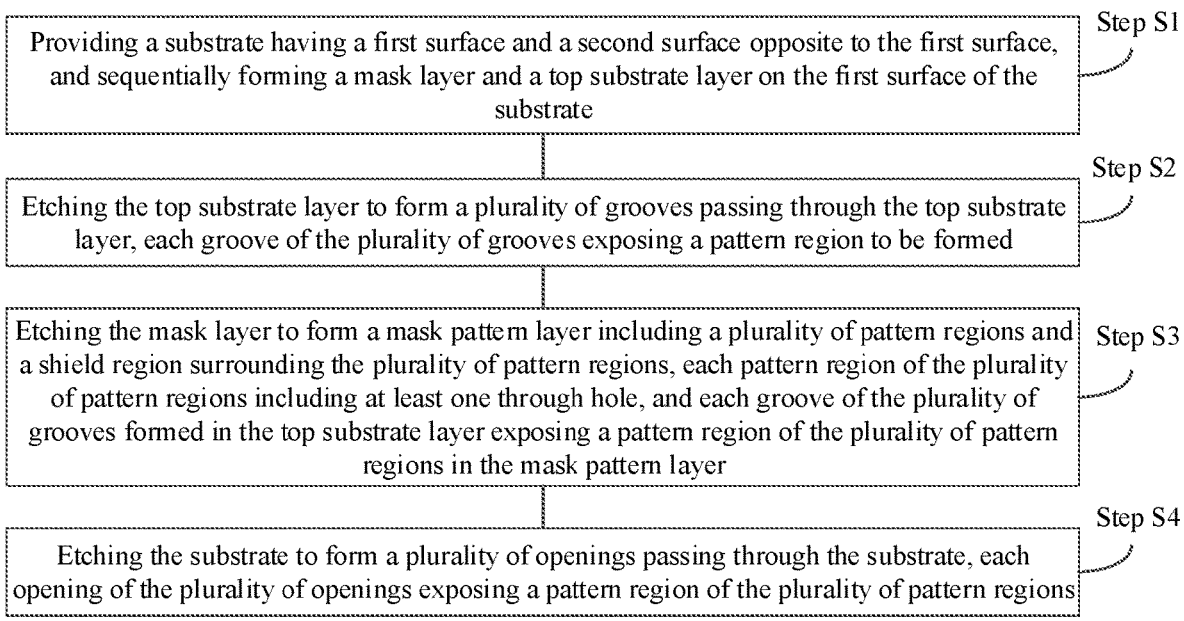
FIG. 7 illustrates a flowchart of an exemplary method for fabricating a mask plate according to some embodiments of the present disclosure.

The present disclosure also provides a method for fabricating mask plates consistent with some embodiments of the present disclosure. FIG. 7 illustrates a flowchart of an exemplary method for fabricating a mask plate according to some embodiments of the present disclosure.

Referring to FIG. 7, in Step S1, at the beginning of the process for fabricating a mask plate, a base structure may be provided. The base structure may include a substrate, a top substrate layer, and a mask layer there-between. In one embodiment, the substrate may have a first surface and a second surface opposite to the first surface. The mask layer and a top substrate layer may be sequentially formed on the first surface of the substrate. In another embodiment, the base substrate may include, for example, a silicon on insulator (SOI) structure.

In Step S2, the top substrate layer may be etched using semiconductor etching process to form a plurality of grooves passing through the top substrate layer. Each groove of the plurality of grooves may expose a pattern region to be formed.

In Step S3, according to the pattern to be formed (i.e., a predetermined pattern), the mask layer may be etched through a semiconductor etching process to form a mask pattern layer. The mask pattern layer may include a plurality of pattern regions and a shield region. At least one through hole may be formed in each pattern region, and the shield region may be formed on the first surface of the substrate to surround the plurality of pattern regions.

In Step S4, the substrate may be etched through a semiconductor etching process to form a plurality of openings passing through the substrate. Each opening of the plurality of openings may expose a pattern region of the plurality of pattern regions.

Figure 8:
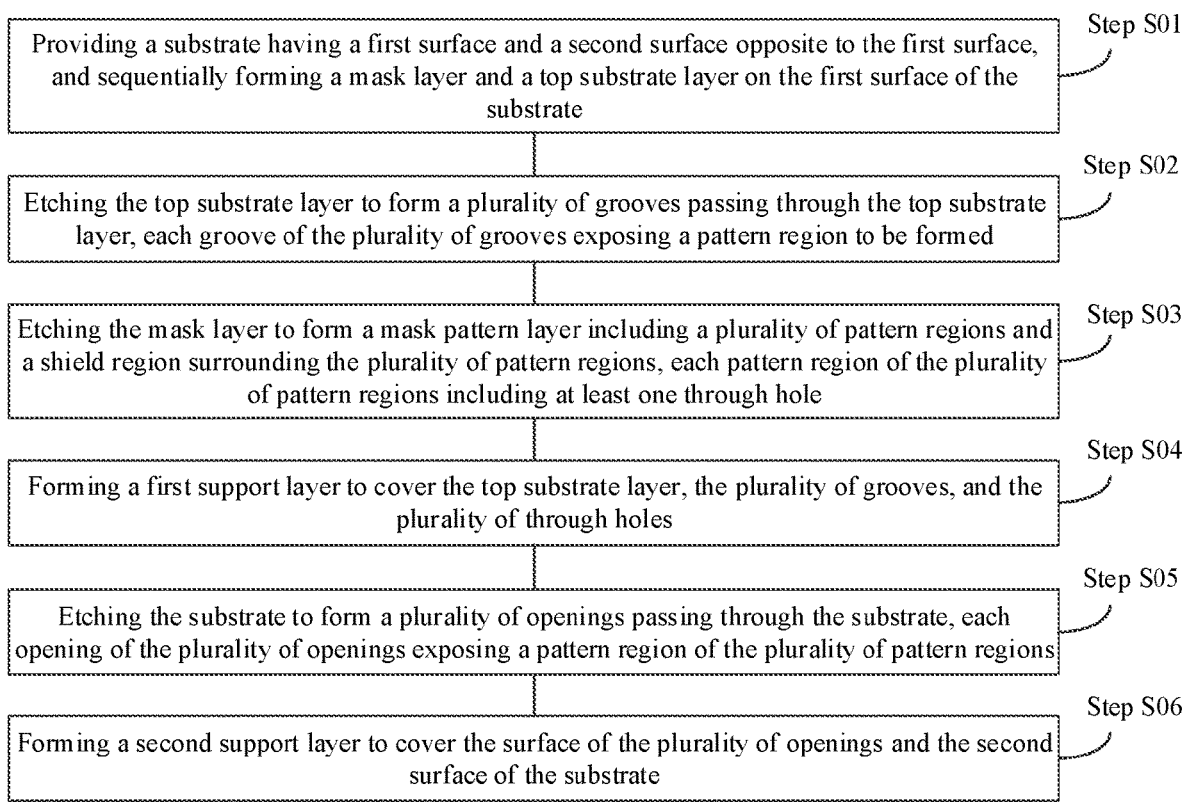
FIG. 8 illustrates a flowchart of an exemplary method for fabricating a mask plate according to some embodiments of the present disclosure.

In the following, an exemplary method consistent with some embodiments of the present disclosure will be described in detail with reference to accompanying figures. FIG. 8 illustrates a flowchart of the exemplary method consistent with some embodiments of the present disclosure. FIGS. 1A-1J illustrate schematic cross-sectional views of structures at certain stages of a method for fabricating an exemplary mask plate according to some embodiments of the present disclosure. Specifically, FIG. 1A through FIG. 1J sequentially illustrate the cross-sectional views of structures obtained during the implementation of the exemplary method. It should be noted that the disclosed method is used to fabricate a structure shown in the embodiments described above, and therefore, the same structures, materials, etc. should also be applied to the fabrication method described here, and the detailed illustration of these structures, materials, etc. will not be described herein.

Referring to FIG. 8, a substrate having a first surface and a second surface opposite the first surface may be provided, and a mask layer and a top substrate layer may be sequentially formed on the first surface of the substrate (Step S01). FIG. 1A illustrates a schematic cross-sectional view of a structure consistent with some embodiments of the present disclosure.

Referring to FIG. 1A, at the beginning of the fabrication process, a substrate 1003 may be provided. The substrate 1003 may have a first surface and a second surface opposite to the first surface. A mask layer 1002a and a top substrate layer 1001 may be sequentially formed on the first surface of the substrate 1003.

The mask layer 1002a may be made of any appropriate insulating material, such as oxide (especially silicon oxide), nitride (such as silicon nitride), carbide (such as silicon carbide), oxynitride (such as silicon oxynitride), etc.

In one embodiment, the substrate 1003 may be the bottom silicon layer of a silicon on insulator (SOI) structure 100. The top substrate layer 1001 may be the top silicon layer of the SOI structure 100. The mask layer 1002a may be a buried layer in the SOI structure 100.

In one embodiment, the mask layer 1002a and the top substrate layer 1001 may be sequentially formed on the substrate 1003 through a process such as CVD, PVD, atomic layer deposition (ALD), etc.

In another embodiment, the mask layer 1002a and the top substrate layer 1001 may be formed on the first surface of the substrate through a bonding process. For example, the mask layer 1002a may be deposited on the substrate 1003, and then through any appropriate bonding process, the top substrate layer 1001 may be bonded to the mask layer 1002a. Alternatively, the mask layer may be deposited on the top substrate layer, and then the mask layer may be bonded to the substrate. In another example, a first mask layer may be deposited on the substrate, a second mask layer may also be deposited on the top substrate layer, and the surface of the substrate with the first mask layer formed on may then be bonded to the surface of the top substrate layer with the second mask layer formed on. After bonding the top substrate layer to the substrate, the first mask layer and the second mask layer located between the top substrate layer and the substrate may together form the mask layer.

It should be noted that during the bonding process, the top substrate layer may be temporarily bonded to a support substrate. The support substrate may provide support to the top substrate layer. After bonding the top substrate layer to the substrate, the support substrate may be removed.

Further, returning to FIG. 8, a plurality of grooves penetrating the top substrate layer may be formed by etching the top substrate layer, each groove of the plurality of grooves exposing a pattern region to be subsequently formed (Step S02). FIG. 1B illustrates a schematic cross-sectional view of a structure consistent with some embodiments of the present disclosure.

Referring to FIG. 1B, the top substrate layer 1001 may be etched through a semiconductor etching process to form a plurality of grooves 101 passing through the top substrate layer 1001. Each groove 101 of the plurality of grooves 101 may expose a pattern region to be formed in a subsequent process.

The plurality of grooves 101 may be formed using any appropriate method known to those skilled in the art. In one embodiment, the method for forming the plurality of grooves 101 may include the following exemplary steps. First, a patterned mask layer may be formed on the surface of the top substrate layer 1001. The patterned mask layer may define various parameters of the grooves to be formed, including the critical dimension, the position, etc. The patterned mask layer may be made of any appropriate material among various mask materials including, but not limited to, hard mask materials and photoresist mask materials. In one example, the patterned mask layer may include a photoresist mask material. Further, the top substrate layer 1001 may be etched using the patterned mask layer as an etch mask until a plurality of predetermined pattern regions are exposed. As such, the plurality of grooves 101 may be formed in the top substrate layer 1001. The etching process may use a dry etching method or a wet etching method. In one embodiment, the etching process may use a dry etching method. Subsequently, the patterned mask layer may be removed. For example, a photoresist mask material may be removed using an ashing method.

In one embodiment, the dimension of each groove 101 formed in the top substrate layer 1001 may be appropriately set according to the needs of the actual dimension of the mask plate, and will not be specifically defined here. The groove 101 may have a rectangular, circular, elliptical, or any other appropriate shape.

Further, returning to FIG. 8, according to the pattern to be formed (i.e. the predetermined pattern), the mask layer may be etched through a semiconductor etching process to form a mask pattern layer, the mask layer including a plurality of pattern regions and a shield region, and at least one through hole formed in each pattern region (Step S03).

Referring to FIG. 1B, according to the pattern to be formed, the mask layer may be etched through a semiconductor etching process to form a mask pattern layer 1002. The mask pattern layer 1002 may include a plurality of pattern regions and a shield region. At least one through hole 102 may be formed in each pattern region, and the shield region may be formed on the first surface of the substrate to surround the plurality of pattern regions.

In one embodiment, each through hole 102 may be vertically disposed in the mask pattern layer 1002. The shape of the through hole 102 in the top view of structure may be appropriately set according to the needs of the actual device process size. For example, in the top view, the through hole 102 may have a rectangular, circular, elliptical, or any other appropriate shape.

In one embodiment, the number of the through holes 102 can be appropriately selected according to the actual process requirements of the mask plate. When the mask plate is used in, for example, an evaporation process for the organic layer in an OLED device, the plurality of through holes 102 may serve as a plurality of holes for evaporation.

The plurality of through holes 102 may be formed using any appropriate method known to those skilled in the art. In one example, the method for forming the plurality of through holes 102 may include the following exemplary steps. First, a patterned mask layer may be formed on the surface of the top substrate layer 1001 and the exposed surface of the mask pattern layer 1002. For example, the mask layer may be made of a photoresist mask material or any other appropriate hard mask material. The patterned mask layer may define various parameters of the through holes to be formed, including the critical dimension, the quantity, the position, etc. Further, the mask pattern layer 1002 may be etched using the patterned mask layer as an etch mask until the substrate 1003 is exposed. As such, the plurality of through holes 102 may be formed. The etching process may use a dry etching method or a wet etching method. In one example, the etching process may use a dry etching method. Subsequently, the mask layer may be removed. For example, a photoresist mask material may be removed using an ashing method.

Further, returning to FIG. 8, a first supporting layer may be formed to cover the surfaces of the top substrate layer, the plurality of grooves, and the plurality of through holes (Step S04). FIG. 1C illustrates a schematic cross-sectional view of a structure consistent with some embodiments of the present disclosure.

Referring to FIG. 1C, a first supporting layer 103 may be formed to cover the surfaces of the top substrate layer 1001, the plurality of grooves 101, and the plurality of through holes 102.

The material used for forming the first supporting layer 103 is described in Exemplary Embodiment 1 provided above, and the details will not be described herein.

The first support layer 103 may be formed by an appropriate deposition method selected according to the material used for forming the first support layer 103. For example, the first support layer 103 containing a metal material may be deposited by a PVD process, a CVD process, an electrolytic plating process, an electroless plating process, or any other appropriate metal deposition process.

The thickness of the first support layer 103 may have any appropriate value, and will not be specifically defined here. However, the total thickness of the first support layer 103 formed on the two opposite sidewall surfaces of each through hole may be smaller than the diameter of the through hole (or smaller than the width or the length of the through hole when the through hole has a square shape). That is, the thickness of the first support layer 103 formed on the sidewall surface of the through hole may need to be smaller than the radius of the through hole in order to ensure that the through hole 102 continuously passes through the mask pattern layer 1002.

In one embodiment, prior to forming the plurality of grooves 101, the fabrication method may also include the following exemplary steps. First, a protective layer may be formed on the surface of the top substrate layer. The protective layer may be formed by using any appropriate method including, but not limited to, CVD, PVD, etc. The thickness of the protective layer may have any appropriate value. For example, the thickness of the protective layer may be in a range of about 50 Å to 1000 Å. Further, a plurality of trenches passing through the protective layer may be formed in the protective layer to expose the regions that are defined as the plurality of grooves on the top substrate layer. In one embodiment, the protective layer may be etched by any appropriate photolithography process and etching process known to those skill in the art to form the plurality of trenches with each trench corresponding to a groove. In various embodiments, the protective layer may be a topmost layer of the mask plate.

In another embodiment, as shown in FIG. 2, prior to forming the protective layer 107, a first support layer 103 may be formed on the top surface of the top substrate layer 1001, and accordingly, the protective layer 107 may be formed on the surface of the first support layer 103. That is, the protective layer 107 may be the topmost layer of the mask plate. After forming the protective layer 107, a plurality of trenches 108 may be formed through the protective layer 107 by etching the protective layer 107. Each trench of the plurality of trenches may expose a groove 101 of the plurality of grooves 101.

In one embodiment, the width or radius of the trench 108 may be larger than or equal to the width or radius of the corresponding groove 101. The protective layer 107 may provide protection for the top substrate layer 1001 disposed under the protective layer 107 to improve the robustness of the mask plate.

In one embodiment, a third support layer 200 may be formed between the mask layer 1002a and the top substrate layer 1001. Accordingly, after etching the top substrate layer 1001, the third support layer 200 may be etched before etching the mask layer 1002a to form the plurality of through holes 102. The plurality of through holes 102 may pass through the third support layer 200.

In another embodiment, referring to FIG. 6, a fourth support layer 200 may be formed by any appropriate method. For example, prior to forming the mask layer, a fourth support layer 300 may be formed to cover the first surface of the substrate. After forming the plurality of through holes 102 and prior to forming the plurality of openings, the fourth support layer 300 may be etched. Similarly, the fourth support layer, the mask layer, and the top substrate layer may be sequentially formed through an appropriate deposition process.

Further, returning to FIG. 8, a plurality of openings passing through the substrate may be formed by etching the substrate, each opening exposing a corresponding pattern region (Step S05). FIG. 1F illustrates a schematic cross-sectional view of a structure consistent with some embodiments of the present disclosure.

Referring to FIG. 1F, the substrate 1003 may be etched through a semiconductor etching process to form a plurality of openings 105. The plurality of openings 105 may pass through the substrate 1003. Each opening 105 of the plurality of openings 105 may expose a pattern region of the plurality of pattern regions.

In one embodiment, the dimension of each opening 105 formed in the substrate may be appropriately set according to the needs of the actual dimension of the mask plate, and will not be specifically defined here. The opening 105 may have a rectangular, circular, elliptical, or any other appropriate shape.

In one embodiment, the plurality of grooves 101 and the plurality of openings 105 may have overlapped regions in the top view of the structure. For example, the plurality of grooves 101 and the plurality of openings 105 may be completely or may be partially overlapped in the view direction perpendicular to the first surface of the substrate 1003.

Figure 4:
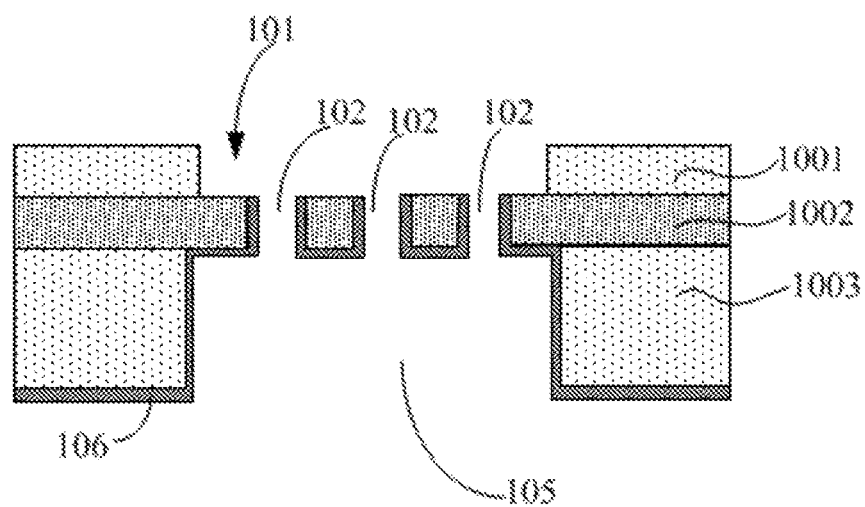
FIG. 4 illustrates a schematic cross-sectional view of another exemplary mask plate according to some embodiments of the present disclosure.

In one embodiment, the process for forming the plurality of openings may include the following exemplary steps. First, referring to FIG. 1D, a sacrificial layer 104 may be formed to fill the plurality of grooves 101 as well as the plurality of through holes 102. The top surface of the sacrificial layer 104 may be leveled with the top surface of the first support layer 103. In some embodiment, when a plurality of trenches 108 are formed in a protective layer 107 as shown in FIG. 4, the sacrificial layer may also fill the plurality of trenches 108.

The sacrificial layer 104 may be made of any appropriate material, such as $SiO_2$, Ge, or amorphous carbon, etc. The sacrificial layer 104 may be formed using a method such as CVD, PVD, ALD, etc. to fill the plurality of grooves 101 and the plurality of through holes 102. In addition, a chemical mechanical polishing (CMP) process may be selectively performed to planarize the surface of the sacrificial layer. The CMP process may be stopped when the surface of the first support layer 103 is exposed.

Further, referring to FIG. 1E, a support substrate 100a may be provided. Then, the support substrate 100a may be bonded to the surfaces of the sacrificial layer 104 and the first support layer 103 to facilitate the operations performed on the substrate 1003.

The support substrate 100a may be any appropriate substrate that can serve as a support, including but not limited to, a glass substrate, a ceramic substrate, a semiconductor substrate, etc. In one embodiment, the support substrate 100a may be a semiconductor substrate, e.g. a silicon wafer.

Any appropriate bonding methods may be used to bond the support substrate 100a to the first support layer 103 and the sacrificial layer 104. For example, a temporary bonding or pasting may be used to bond the support substrate 100a to the first support layer 103 and the sacrificial layer 104. In one embodiment, when a bonding layer is used to bond the support substrate and the first support layer 103, the bonding layer may be made of a material including, but not limited to, an organic polymer material or an ultraviolet-denatured organic material.

It should be noted that the steps for forming the sacrificial layer 104 and bonding the support substrate 100a to the first supporting layer 103 may be selectively performed according to actual process requirements. In one embodiment, without using the support substrate 100a, only the sacrificial layer 104 may be formed. In other embodiments, the sacrificial layer may be formed and the support substrate may also be provided and bonded to both the surface of the sacrificial layer and the surface of the first support layer. Alternatively, the sacrificial layer may not be formed, but only the support substrate may be provided and further bonded to the surface of the first support layer.

In one embodiment, referring to FIG. 1F, the method for forming the plurality of openings may also include the following exemplary steps. First, a patterned mask layer may be formed on the second surface of the substrate 1003. The patterned mask layer may define various parameters of the plurality of grooves to be formed, including the critical dimension, the position, etc. Then, the substrate 1003 may be etched using the patterned mask layer as an etch mask until the mask pattern layer 1002 and a portion of the first support layer 103 are exposed. As such, the plurality of openings may be formed. The etching process may use a dry etching method or a wet etching method. In one embodiment, the etching process may use a dry etching method. Further, the patterned mask layer may be removed. For example, a photoresist mask material may be removed using an ashing method.

Further, returning to FIG. 8, a second support layer may be formed to cover the surfaces of the plurality of openings and the second surface of the substrate (Step S06). FIG. 1G illustrates a schematic cross-sectional view of a structure consistent with some embodiments of the present disclosure.

Referring to FIG. 1G, a second support layer 106 may be formed to cover the surfaces of the plurality of openings 105 and also cover the second surface of the substrate.

For the method for forming the second support layer 106, reference may be made to the method described above for forming the first support layer 103, and the details are not repeated here.

The second support layer 106 may have an appropriate thickness known to those skilled in the art, and will not be specifically defined here.

It should be noted that the second support layer 106 may use the same metal material as the first support layer 103, or the second support layer 106 and the first support layer 103 may use different metal materials, which can be appropriately selected according to the actual process.

Further, in one example, after forming the second support layer 106, the method may also include removing a portion of the first support layer 103 and a portion of the second support layer 106 that seals the openings of the corresponding through holes 102 to ensure the through holes 102 to be connected to the groove 101 and the opening 105.

In one embodiment, removing the portion of the first support layer 103 and the portion of the second support layer 106 that seals the openings of the corresponding through holes 102 to ensure the through holes 102 to be connected to the groove 101 and the opening 105 may including implementing Steps A1-A3 as described in the following.

In Step A1, as shown in FIG. 1H, the support substrate 100a (referring to FIG. 1G) may be removed from the substrate 1003. The method used to remove the support substrate 100a from the substrate 1003 may be selected according to the bonding method used to bond the support substrate 100a to the substrate 1003. For example, using high temperature or ultraviolet irradiation, the bonding layer used to bond the support substrate 100a to the substrate 1003 may be denatured, and thus may lose its viscosity. As a result, the support substrate 100a may be separated from the substrate 1003.

Further, in Step A2, as shown in FIG. 1I, a portion of the sacrificial layer 104 together with a portion of the first support layer 103 and the second support layer 106 that seals the openings of the through holes 102 may be removed through an etching process. After the etching process, a portion of the first support layer 103 may remain on the sidewall surfaces of the through holes 102.

In one embodiment, a patterned mask layer may be first formed on the surface of the sacrificial layer 104. The patterned mask layer may expose the surface of the portion of the sacrificial layer that needs to be removed through etching. For example, the patterned mask layer may be made of a photolithography mask material or any other appropriate mask material such as a hard mask material. Then, the portion of the sacrificial layer 104 together with a portion of the first support layer 103 and the second support layer 106 that seals the openings of the through holes 102 may be sequentially removed through an etching process using the patterned mask layer as an etch mask. That is, the etching process may be performed to etch through the first support layer 103 and the second support layer 106. The etching process may use a dry etching method. Further, the patterned mask layer may be removed.

In Step A3, as shown in FIG. 1J, the sacrificial layer 104 may be removed. The sacrificial layer 104 may be removed by using a dry etching method or a wet etching method. In one embodiment, a wet etching method may be used to remove the sacrificial layer 104. The wet etching method may demonstrate a large etching rate on the sacrificial layer 104 while have a small etching rate on the first support layer 103 and the second support layer 106. As such, when etching the sacrificial layer 104, etching damages to the first support layer 103 and the second support layer 106 may be avoided.

In another embodiment, removing the portion of the first support layer 103 and the portion of the second support layer 106 that seal the openings of the through holes 102 to ensure the through holes 102 to be connected to the groove 101 and the opening 105 may including implementing Steps B1-B3 as described in the following.

In Step B1, the support substrate 100a may be removed from the substrate 1003.

In Step B2, the sacrificial layer 104 may be removed to expose the first support layer 103.

Further, in Step B3, the portion of the first support layer 103 and the portion of the second support layer 106 that seal the openings of the through holes 102 may be sequentially removed. Alternatively, the portion of the second support layer 106 and the portion of the first support layer 103 that seal the openings of the through holes 102 may be sequentially removed. As such, the plurality of through holes 102 may be connected to the groove 101 and the opening 105.

For example, a patterned mask layer may be formed on the surface of the first support layer 103. The patterned mask layer may expose the surface of the portion of the first support layer 103 that needs to be removed through etching. Further, the portion of the first support layer 103 and the portion of the second support layer 106 that seal the openings of the through holes 102 may be sequentially removed through an etching process using the patterned mask layer as an etch mask, and then the patterned mask layer may be removed. Alternatively, a patterned mask layer may be formed on the surface of the second support layer 106. The patterned mask layer may expose the surface of the portion of the second support layer 106 that needs to be removed through etching. Further, the portion of the second support layer 106 and the portion of the first support layer 103 that seal the openings of the through holes 102 may be sequentially removed through an etching process using the patterned mask layer as an etch mask, and then the patterned mask layer may be removed.

It should be noted that for the implementation of Steps B1-B3, reference may be made to the implementation of Steps A1-A3 described above, and the details are not repeated here.

In another embodiment, removing the portion of the first support layer 103 and the portion of the second support layer 106 that seal the openings of the through holes 102 to ensure the through holes 102 to be connected to the groove 101 and the opening 105 may including implementing Steps C1-C3 as described in the following.

First, in Step C1, the portion of the second support layer 106 and the portion of the first support layer 103 that seal the openings of the through holes 102 may be sequentially removed through an etching process. The etching process may be performed until the sacrificial layer 104 is exposed. For example, a patterned mask layer such as a photoresist mask layer may be formed on the second support layer 106. The patterned mask layer may expose the surface of the portion of the second support layer 106 that needs to be removed. Then, the second support layer 106 and the first support layer 103 may be sequentially etched through an etching process using the patterned mask layer as an etch mask. The etching process may be performed until the sacrificial layer 104 is exposed. Further, the patterned mask layer may be removed.

Further, in Step C2, the sacrificial layer 104 may be removed.

In Step C3, the support substrate 100a may be removed from the substrate 1003.

It should be noted that in some embodiments, Step C3 may be implemented before implementing Step C2. For the implementation of Steps C1-C3, reference may be made to the implementation of Steps A1-A3 described above, and the details are not repeated here.

Exemplary Embodiment 3

The present disclosure also provides another method for fabricating mask plates consistent with some embodiments of the present disclosure. Multiple steps of the method are substantially the same as the steps of the method described above, although the implementation order of the steps may be different. In the following, to avoid repeating the descriptions, only some of the steps according to the fabrication method are described.

Figure 9:
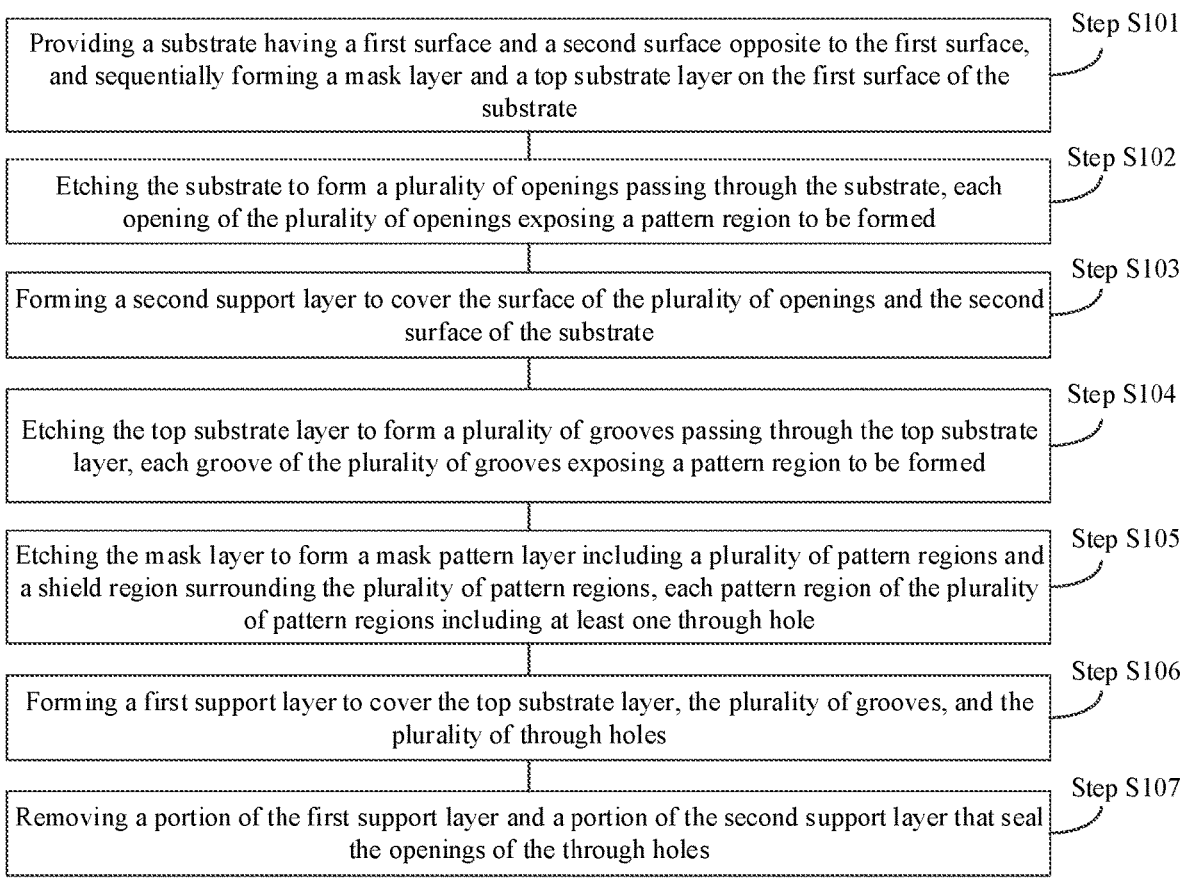
FIG. 9 illustrates a flowchart of another exemplary method for fabricating a mask plate according to some embodiments of the present disclosure.

FIG. 9 illustrates a flowchart of an exemplary method for fabricating a mask plate according to some embodiments of the present disclosure. Referring to FIG. 9, in Step S101, a substrate may be provided. The substrate may have a first surface and a second surface opposite to the first surface. A mask layer and a top substrate layer may be sequentially formed on the first surface of the substrate. For the implementation of Step S101, reference may be made to the above description of Step S01, and the details are not repeated here.

Referring to FIG. 9, further in Step S102, the substrate may be etched through a semiconductor etching process to form a plurality of openings passing through the substrate. Each opening of the plurality of openings may expose a pattern region to be formed in a subsequent process.

Referring to FIG. 9, further in Step S103, a second support layer may be formed to cover the surfaces of the plurality of openings as well as the second surface of the substrate.

Referring to FIG. 9, further in Step S104, the top substrate layer may be etched through a semiconductor etching process to form a plurality of grooves passing through the top substrate layer. Each groove of the plurality of grooves may expose a pattern region to be formed in a subsequent process.

Referring to FIG. 9, further in Step S105, according to the pattern to be formed, the mask layer may be etched through a semiconductor etching process to form a mask pattern layer. The mask pattern layer may include a plurality of pattern regions and a shield region. At least one through hole may be formed in each pattern region, and the shield region may be formed on the first surface of the substrate to surround the plurality of pattern regions.

For example, the method for forming the through holes may include the following exemplary steps. First, a patterned mask layer may be formed on the surface of the portion of mask pattern layer that is exposed in the openings and the surface of the top substrate layer. The patterned mask layer may define various parameters of the plurality of through holes that need to be formed, including the pattern, the quantity, the critical dimension, etc. The mask layer may then be etched using the patterned mask layer as an etch mask until the second support layer is exposed. As such, the plurality of through holes may be formed. Further, the patterned mask layer may be removed.

Referring to FIG. 9, further in Step S106, a first support layer may be formed to cover the surface of the top substrate layer, the surfaces of the grooves, and the surfaces of the through holes.

Referring to FIG. 9, further in Step S107, a portion of the first support layer and the second support layer that seals the openings of the through holes may be removed through etching. For the method for removing the portion of the first support layer and the second support layer that seals the openings of the through holes, reference may be made to the implementation of Steps A1-A3, Steps B1-B3, and C1-C3 described above, and the details are not repeated here.

It should be noted that according to the method described in Exemplary Embodiment 2, the plurality of grooves and the plurality of through holes may be formed first, and the plurality of openings may then be formed; however, according to the method described in Exemplary Embodiment 3, the plurality of openings may be formed first, and the plurality of grooves and through holes may then be formed. The illustration provided in the present disclosure may also be applicable to other methods, e.g. forming a plurality of opening and a plurality of through holes first, and then forming a plurality of trenches, or forming a plurality of trenches first, and then forming the plurality of openings and the plurality of through holes. In the present disclosure, these other methods are not described in detail.

Exemplary Embodiment 4

The present disclosure also provides a method for fabricating mask plates. By adopting the fabrication method, a structure illustrated in FIG. 5 may be formed. To avoid repeating the descriptions, only the major steps according to the fabrication method are described. For the implementation of each step, reference may be made to the implementation of the methods provided above, and the details are not repeated here.

Figure 10:
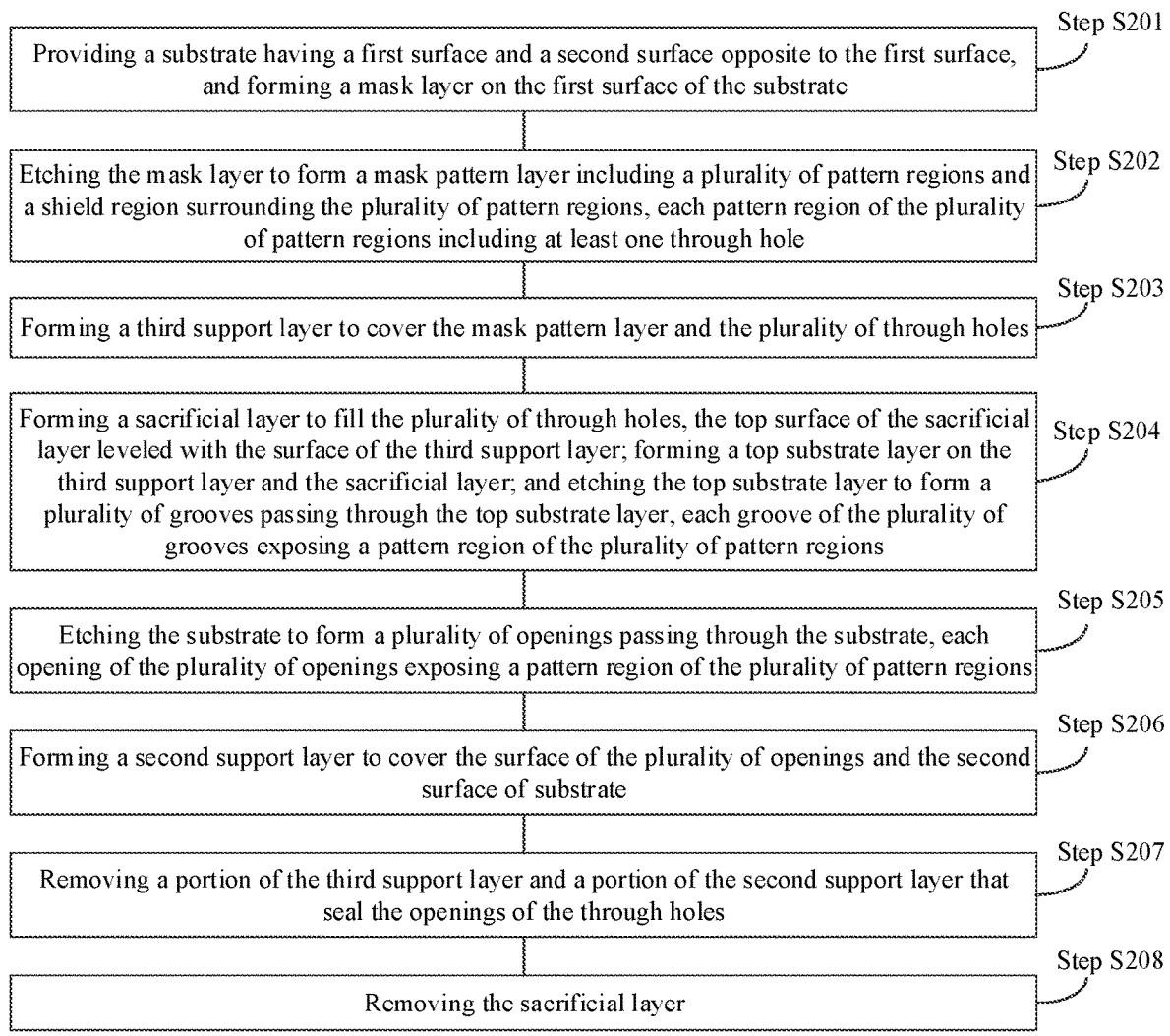
FIG. 10 illustrates a flowchart of another exemplary method for fabricating a mask plate consistent with the exemplary mask plate shown in FIG. 5.

FIG. 10 illustrates a flowchart of an exemplary method for fabricating a mask plate consistent with the exemplary mask plate shown in FIG. 5. Referring to FIG. 10 and FIG. 5, in Step S201, a substrate 1003 may be provided, and a mask layer may be formed on the substrate.

Further, in Step S202, according to the pattern to be formed, the mask layer may be etched through a semiconductor etching process to form a mask pattern layer 1002. The mask pattern layer 1002 may include a plurality of pattern regions and a shield region. At least one through hole 102 may be formed in each pattern region, and the shield region may be formed on the first surface of the substrate to surround the plurality of pattern regions.

Further, in Step S203, a third support layer 200 may be formed to cover the surface of the mask pattern layer 1002 and the surfaces of the through holes 102.

Further, in Step S204, a sacrificial layer may be formed to fill the plurality of through holes, and a top substrate layer 1001 may be formed on the third support layer 200 and the sacrificial layer. A plurality of grooves 101 may be formed in the top substrate layer 1001, and the grooves 101 may pass through the top substrate layer 1001. Each groove 101 of the plurality of grooves 101 may expose a pattern region of the plurality of pattern regions of the mask pattern layer 1002. Thus, each groove 101 of the plurality of grooves 101 may expose the plurality of through holes formed in the corresponding pattern region.

The top substrate layer 1001 and the plurality of grooves 101 may be formed by any appropriate method known to those skilled in the art. For example, first, a sacrificial layer may be formed to fill the plurality of through holes, and the top surface of the sacrificial layer may be leveled with the surface of the third support layer; then, a top substrate layer may be deposited on the surfaces of the third support layer and the sacrificial layer; further, the top substrate layer may be etched to form the plurality of grooves; a first support layer (not shown) may be selectively formed on the surfaces of the top substrate layer 1001 and the plurality of grooves 101, and then the portion of the first support layer formed on the sacrificial layer may be removed through a photolithography process or an etching process.

Further, in Step S205, the substrate may be etched through a semiconductor etching process to form a plurality of openings passing through the substrate. Each opening of the plurality of openings may expose a pattern region of the plurality of pattern regions. For the method used to form the plurality of openings, reference may be made to the method for forming the openings described in the embodiments provided above, and the details are not repeated here.

Further, in Step S206, a second support layer may be formed to cover the surfaces of the plurality of openings and the second surface of the substrate.

Further, in Step S207, a portion of the third support layer and the second support layer that seals the plurality of through holes may be removed through etching.

Further, in Step S208, the sacrificial layer formed to fill the plurality of through holes may be then removed.

The method described above is merely for illustrative purposes. The illustration provided in the present disclosure may also be applicable to other methods that can be used to form a structure similar to the mask plate shown in FIG. 5.

Exemplary Embodiment 5

The present disclosure also provides a method for fabricating mask plates. By adopting the fabrication method, a structure illustrated in FIG. 6 may be formed. To avoid repeating the descriptions, only the major steps according to the fabrication method are described. For the implementation of each step, reference may be made to the implementation of the methods provided above, and the details are not repeated here.

Figure 11:
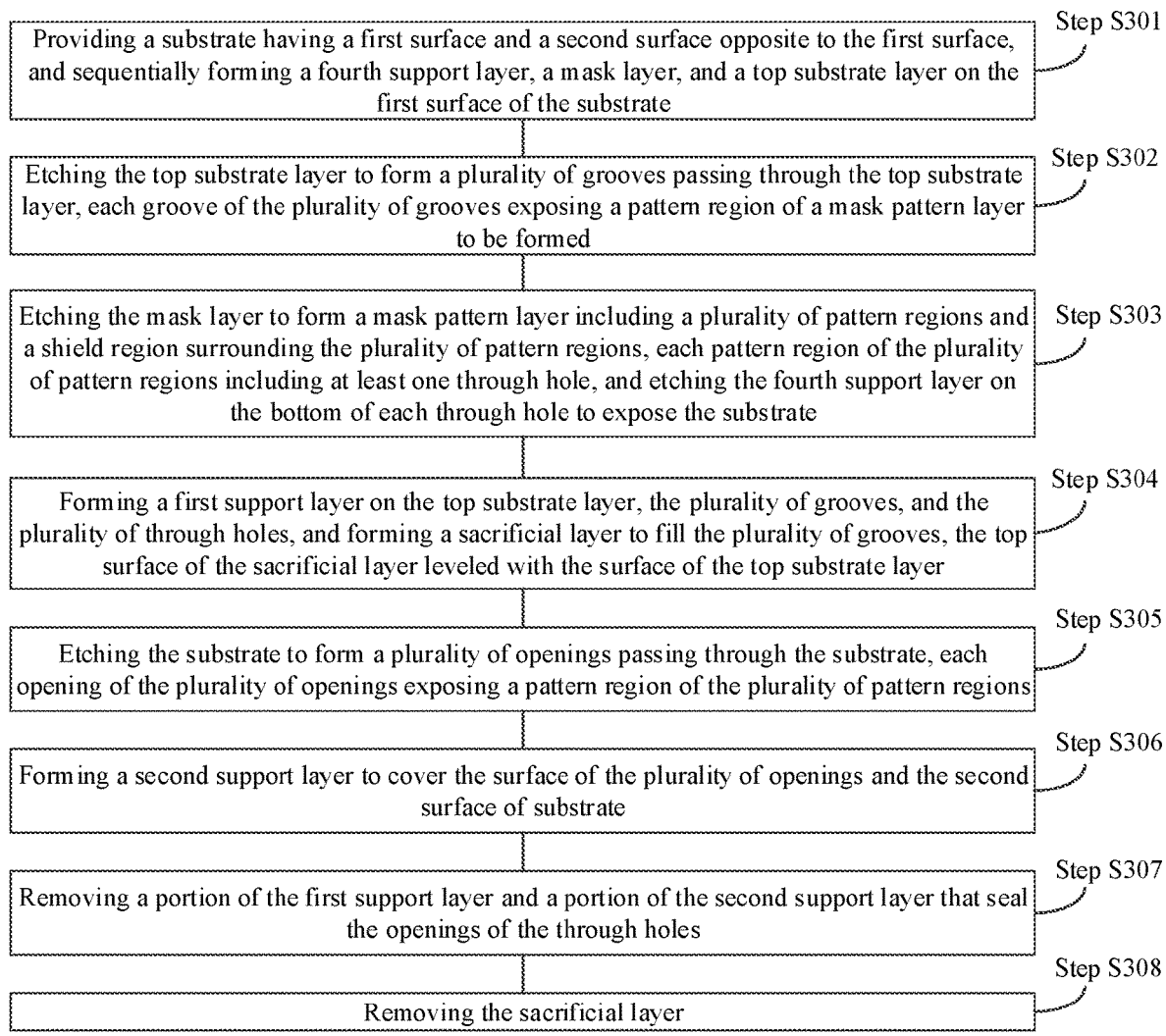
FIG. 11 illustrates a flowchart of another exemplary method for fabricating a mask plate consistent with the exemplary mask plate shown in FIG. 6.

FIG. 11 illustrates a flowchart of an exemplary method for fabricating a mask plate consistent with the exemplary mask plate shown in FIG. 6. Referring to FIG. 11 and FIG. 6, in Step S301, a substrate 1003 may be provided, and a fourth support layer 300, a mask layer, and a top substrate layer 1001 may be sequentially formed on the substrate 1003.

Further, in Step S302, the top substrate layer may be etched through a semiconductor etching process to for a plurality of grooves passing through the top substrate layer. Each groove of the plurality of grooves may expose a pattern region of the mask pattern layer to be formed in a subsequent process.

Further, in Step S303, according to the pattern to be formed, the mask layer may be etched through a semiconductor etching process to form a mask pattern layer 1002. The mask pattern layer 1002 may include a plurality of pattern regions and a shield region. At least one through hole 102 may be formed in each pattern region, and the shield region may be formed on the first surface of the substrate to surround the plurality of pattern regions. After etching the mask layer, the etching process may be further performed to etch the fourth support layer 300 until the through holes 102 pass through the fourth support layer 300. That is, the portion of the fourth support layer 300 on the bottom of each through hole 102 may be removed to expose the substrate 1003.

Further, in Step S304, a first support layer (not shown) may be selectively formed on the surface of the top substrate layer 1001, the surfaces of the plurality of grooves 101, and the surfaces of the plurality of through holes. Then, a sacrificial layer may be formed to fill the plurality of through holes 102, and the top surface of the sacrificial layer may be leveled with the surface of the top substrate layer 1001.

Further, in Step S305, the substrate may be etched through a semiconductor etching process to form a plurality of openings passing through the substrate. Each opening of the plurality of openings may expose a pattern region of the plurality of pattern regions. The plurality of openings may be formed by a method described above, and the details are not repeated here.

Further, in Step S306, a second support layer (not shown) may also be selectively formed to cover the surfaces of the openings and the second surface of the substrate 1003.

Further, in Step S307, a portion of the first support layer and a portion of the second support layer that seal the openings of the through holes may be removed through an etching process.

Further, in Step S308, the sacrificial layer may be removed.

The method described above is merely for illustrative purposes. The illustration provided in the present disclosure may also be applicable to other methods that can be used to form a structure similar to the mask plate shown in FIG. 6.

As such, the key steps of the methods for fabricating mask plates according to various embodiments of the present disclosure are described in detail. A complete fabrication method may also include other steps, which are not described in the present disclosure.

In summary, the fabrication methods according to the embodiments of the present disclosure adopt a semiconductor process, including deposition, photolithography, etching, etc. to fabricate mask plates. Compared with a mask plate made through fine metal processing, where the precision of the fine processing of the metal mask may be only on the order of micrometers, a mask plate made by a semiconductor process according to the present disclosure may be able to achieve a precision on the order of nanometers. Therefore, semiconductor processing may improve the quality and the positional accuracy of the openings and the through holes in the mask pattern region. In addition, semiconductor processing may be conducive to reducing the sizes of the mask openings and the through holes as well as the thickness of the mask structure, and thus may satisfy the continuous reduction of the sizes of the semiconductor structure features and reduce the restrictions on the evaporation process associated with the sizes of the mask openings and the through holes as well as the thickness of the mask structure. Further, the substrate can serve as a mask frame for the mask plate to support and fix the mask structure. Because the mask structure is formed on the substrate by a semiconductor process, compared to a mask plate formed using fine metal processing, the disclosed mask plate may be able to reduce the problem caused by the displacement between the mask structure and the substrate. Therefore, the mask plate according to the present disclosure demonstrates higher quality and precision, and thus may be conducive to improving the precision of the evaporation process. When the disclosed mask plate is used in an evaporation process, the deposition quality of the evaporated material can be improved, and the quality of the subsequently-fabricated product can be improved.

The details of the present disclosure have been described through the embodiments provided above. However, it should be understood that the above embodiments are only for the purpose of illustration and description. Further, those skilled in the art can understand that the present disclosure is not limited to the above embodiments, and various modifications and changes can be made according to the principles of the present disclosure. These modifications and modifications are all in the scope of the present disclosure. The scope of the present disclosure is defined by the appended claims and their equivalents.

What is claimed is:

1. A mask plate, comprising:
   a substrate, having a first surface and a second surface opposite to the first surface, wherein the substrate contains an opening passing through the substrate;
   a mask pattern layer, formed on the first surface of the substrate and including a pattern region and a shield region surrounding the pattern region, wherein the pattern region includes at least one through hole, and the opening formed in the substrate exposes the pattern region and the at least one through hole in the pattern region;
   a top substrate layer, formed on the mask pattern layer, wherein the top substrate layer contains a groove passing there-through, and the groove formed in the top substrate layer exposes the pattern region in the mask pattern layer and exposes the at least one through hole in the pattern region; and
   a protective layer, formed on the top substrate layer and containing a trench formed through the protective layer to connect to the groove, wherein the protective layer is a topmost layer of the mask plate.

2. The mask plate according to claim 1, wherein:
   the substrate is a bottom silicon layer of a silicon on insulator (SOI) structure;
   the top substrate layer is a top silicon layer of the SOI structure; and
   the mask pattern layer is a buried layer of the SOI structure.

3. The mask plate according to claim 1, wherein:
   the substrate is made of at least one of Si, Ge, SiGe, SiC, SiGeC, InAs, GaAs, InP, and InGaAs; and
   the top substrate layer is made of at least one of Si, Ge, SiGe, SiC, SiGeC, InAs, GaAs, InP, and InGaAs.

4. The mask plate according to claim 1, further including a support layer, wherein the support layer includes at least one of:
   a first support layer, covering one or more of the top substrate layer, a portion of the mask pattern layer exposed by the groove, and a sidewall surface of the at least one through hole in the pattern region; and
   a second support layer, covering one or more of a portion of the mask pattern layer exposed by the opening, the second surface of the substrate, a sidewall surface of the at least one through hole in the pattern region.

5. The mask plate according to claim 1, wherein:
   a thickness of the support layer formed on the sidewall surface of the at least one through hole is smaller than a radius of the through hole, and/or
   the support layer is made of a metal including at least one of Ni, Ag, Au, Cu, Pt, Cr, Mo, Ti, Ta, Sn, W, Al, or silicon nitride.

* * * * *